US007152082B2

(12) United States Patent
McGrath

(10) Patent No.: US 7,152,082 B2
(45) Date of Patent: Dec. 19, 2006

(54) AUDIO FREQUENCY RESPONSE PROCESSING SYSTEM

(75) Inventor: David Stanley McGrath, New South Wales (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 695 days.

(21) Appl. No.: 10/344,682

(22) PCT Filed: Aug. 14, 2001

(86) PCT No.: PCT/AU01/01004

§ 371 (c)(1),
(2), (4) Date: Feb. 13, 2003

(87) PCT Pub. No.: WO02/15642

PCT Pub. Date: Feb. 21, 2002

(65) Prior Publication Data

US 2003/0172097 A1 Sep. 11, 2003

(51) Int. Cl.
*G06F 17/10* (2006.01)
*H03G 3/00* (2006.01)

(52) U.S. Cl. ........................................ 708/300; 381/61

(58) Field of Classification Search ................ 708/300, 708/315; 381/61, 62, 63
See application file for complete search history.

(56) References Cited

U.S. PATENT DOCUMENTS

| | | | | |
|---|---|---|---|---|
| 4,866,648 | A | 9/1989 | Usui | |
| 5,544,249 | A * | 8/1996 | Opitz | 381/63 |
| 6,504,933 | B1 * | 1/2003 | Chung | 381/1 |
| 6,519,342 | B1 * | 2/2003 | Opitz | 381/61 |
| 6,741,706 | B1 | 5/2004 | McGrath et al. | |
| 2002/0106090 | A1 * | 8/2002 | Dahl et al. | 381/63 |
| 2002/0116422 | A1 * | 8/2002 | McGrath | 708/103 |

FOREIGN PATENT DOCUMENTS

| | | |
|---|---|---|
| CA | 2107320 | 3/1997 |

* cited by examiner

*Primary Examiner*—Chuong D. Ngo
(74) *Attorney, Agent, or Firm*—Dov Rosenfeld; Inventek

(57) ABSTRACT

The invention provides a method and system for forming an output impulse response function. The method includes the steps of creating an initial impulse response, and dividing the impulse response into a head portion and a tail portion. The tail portion is high pass filtered, and low frequency components of the head portion are boosted. The low frequency boosted and high pass filtered respective head and tail portions are then combined into a modified output impulse response, which can then be used to spatialize an audio signal by convolving it.

15 Claims, 7 Drawing Sheets

AUDIO FREQUENCY RESPONSE PROCESSING SYSTEM

FIELD OF THE INVENTION

This present invention relates to the field of audio signal processing and, in particular, to the field of simulating impulse response functions so as to provide for spatialization of audio signals.

BACKGROUND OF THE INVENTION

The human auditory system has evolved accurately to locate sounds that occur within the environment of the listener. The accuracy is thought to be derived primarily from two calculations carried out by the brain. The first is an analysis of the initial sound arrival and arrival of near reflections (the direct sound or head portion of the sound) which normally help to locate a sound; the second is an analysis of the reverberant tail portion of a sound which helps to provide an "environmental feel" to the sound. Of course, subtle differences between the sounds received at each ear are also highly relevant, especially upon the receipt of the direct sound and early reflections.

For example, in FIG. 1, there is illustrated a speaker 1 and listener 2 in a room environment. Taking the case of a single ear 3, the listener 2 receives a direct sound 4 from the speaker and a number of reflections 5, 6, and 7. It will be noted that the arrangement of FIG. 1 essentially shows a two dimensional sectional view and reflections off the floors or the ceilings are not shown. Further, the audio signal to only one ear is illustrated.

Often it is desirable to simulate the natural process of sound around a listener. For example, the listener, listening to a set of headphones, can be provided with an "out of head" experience of sounds appearing to emanate from an external environment. This can be achieved through the known process of determining an impulse response function for each ear for each sound and convolving the impulse response functions with a corresponding audio signal so as to produce the environmental effect of locating the sound in the external environment.

SUMMARY OF THE INVENTION

According to a first aspect of the invention there is provided:

(a) a method of forming an output impulse response function comprising the steps of creating an initial impulse response having a head portion and a tail portion, (b) high pass filtering at least part of said tail portion to form a high pass filtered tail portion, and (c) combining said high pass filtered tail portion with said head portion to form an output impulse response.

Preferably, the method includes the step of boosting low frequency components of said head portion of said initial impulse response prior to step (c).

Advantageously, the method includes the step of dividing the initial impulse response into the head and tail portions.

Conveniently, the method further comprises the step of utilising said output impulse response in addition to other impulse responses to virtually spatialize an audio signal around a listener.

The invention extends to an apparatus for forming an output impulse response function comprising:

(a) dividing means for dividing an initial impulse response into a head portion and a tail portion;

(b) high pass filtering means for high pass filtering at least part of the tail portion to form a high pass filtered tail portion;

(c) combining means for combining said high pass filtered tail portion with said head portion to form an output impulse response.

The invention further extends to an audio processing system for spatializing an audio signal, said system comprising:

an input means for inputting said audio signal;

convolution means connected to said input means, for convolving said audio signal with at least one impulse response function, said impulse response function having a head component and a high pass filtered tail component.

The invention still further contemplates a method of processing an audio input signal comprising the steps of:

(a) dividing an audio input signal into first and second streams;

(b) high pass filtering the second stream of the audio input signal;

(c) applying a reverberant tail to the second stream of the audio input signal; and (d) combining the audio input signal from first stream and the high pass filtered reverberated audio signal from the second stream.

The method may include the step of boosting low frequency components of the audio input signal of the first stream.

The invention still further provides a method of processing an audio input signal comprising the steps of:

(a) streaming the audio input signal into at least first and second streams;

(b) providing at least one high pass filtered tail impulse response signal;

(c) convolving the first stream of the audio input with the high pass filtered tail impulse response signal;

(d) providing at least one head impulse response signal;

(e) convolving the second stream of the audio input with the head impulse response signal; and (f) combining the convolved outputs to provide a spatialized audio signal.

Typically, the method includes the steps of boosting the low frequency component of the second stream to compensate for the reduction in low frequency components of the first stream.

The method typically includes the further steps of measuring the reduction in low frequency components from the high pass filtered tail impulse response, and using the measurement to derive a compensation factor which is ultimately applied to the second stream.

Conveniently, the method includes the steps of streaming the audio input signal into a third stream, adjusting the gain of the signal using the compensation factor, low pass filtering the adjusted signal, and combining the low pass filtered adjusted signal with the second stream, for subsequent convolving with the head impulse response signal.

The invention still further provides a method of spatializing an audio signal comprising the steps of:

(a) providing a head portion of an impulse response signal;

(b) providing a tail portion of an impulse response signal;

(c) high pass filtering the tail portion;

(d) convolving the high pass filtered tail portion with the audio signal;

(e) convolving the head portion with the audio signal; and
(f) combining the convolved signals to provide a spatialized output signal.

BRIEF DESCRIPTION OF THE DRAWINGS

Notwithstanding any other forms which may fall in the scope of the present invention, the preferred forms of the invention will now be described by way of the example only with reference to the accompanying drawings in which.

DETAILED DESCRIPTION OF THE EMBODIMENTS

Research by the present inventor into the nature of measured impulse response functions has lead to various unexpected discoveries which can be utilised to advantageous effect in reducing the computational complexity of the convolution process in audio spatialization. From various measurements made by the present inventor of human listeners to audio spatialization systems the following important factors have been uncovered.

First, the low frequency components in the tail of an impulse response do not contribute to the sense of an enveloping acoustic space. Generally, this sense of "space" is created by the high frequency (greater than around 300 Hz) portion of the reverberant tail of the room impulse response.

Secondly, the low-frequency part of the tail of the reverberant response is often the cause of undesirable 'resonance' effects, particularly if the reverberant room response includes the modal resonances that are present in almost all rooms. This is often perceived by the listener as "bad equalisation".

Figure 1:
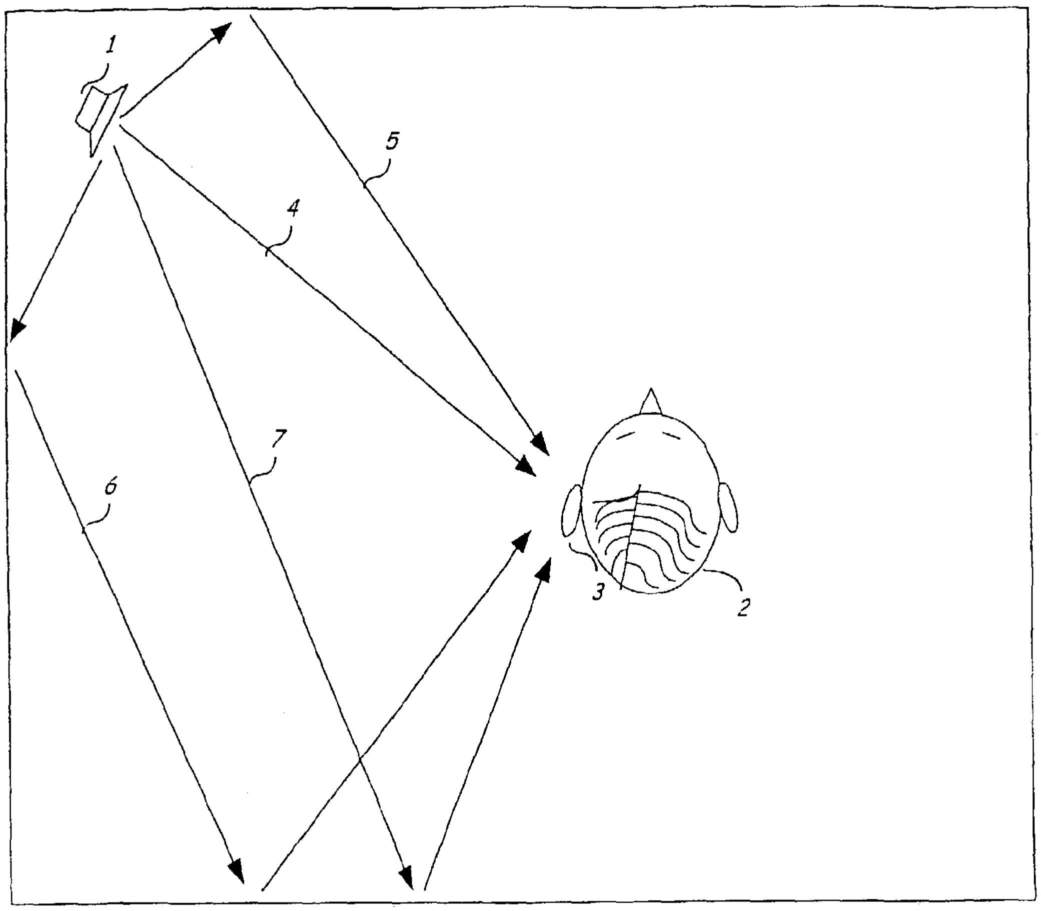
FIG. 1 illustrates schematically the process of projection of a sound to a listener in a room environment.
Figure 2:
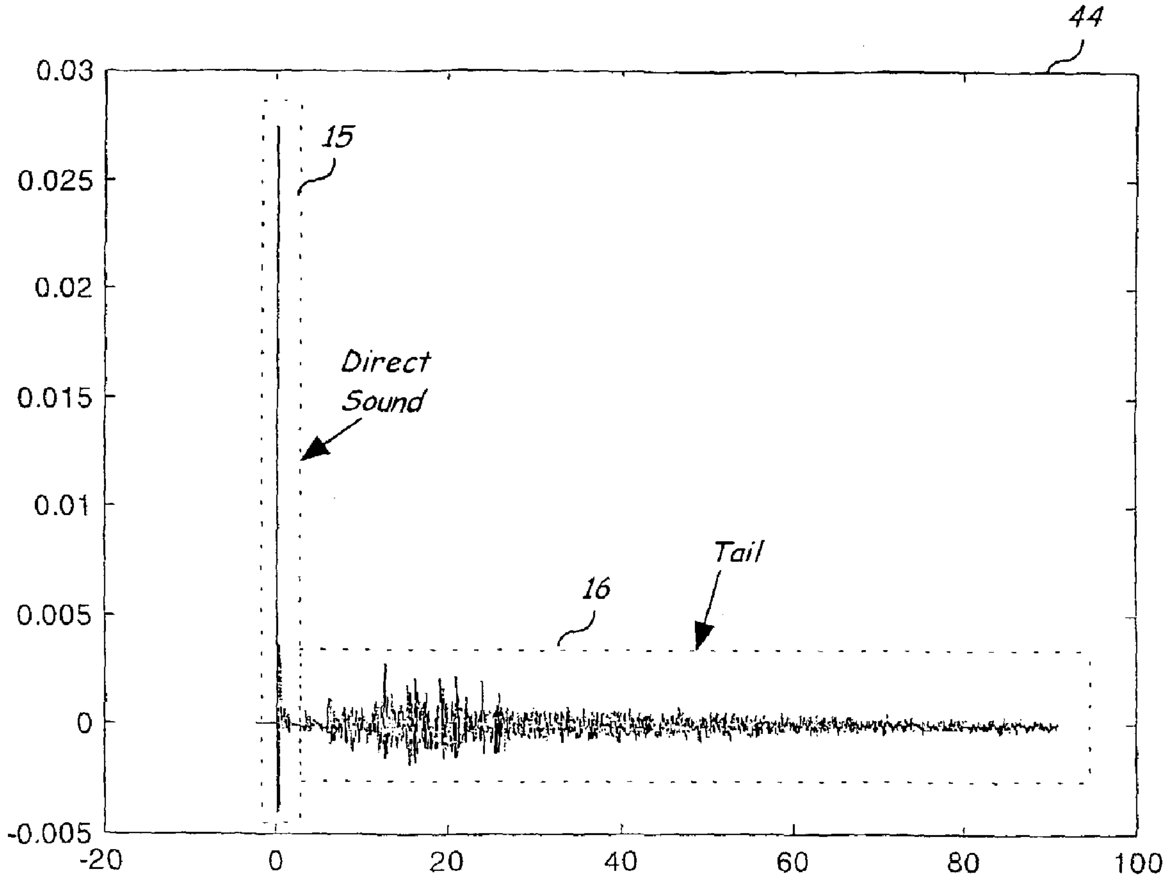
FIG. 2 illustrates a typical impulse response of a room.

In FIG. 2 there is shown an example of an impulse response function 14 from a sound source in a room environment similar to that of FIG. 1. The response function includes a direct sound or head portion 15 and a tail portion 16. The tail portion 16 includes substantial low frequency components that do not provide significant directional information. Typically, the head portion occupies only the first two to three milliseconds of the total impulse response, and (as in the example of FIG. 3), the head portion is often separated from the tail by a short segment of zero signal 17. It will be appreciated that the head portion includes direct sound (i.e. the first sound arrival 15A), but may also include initial closely following indirect sound (say floor and close wall direct echoes 15A to 15E). Although head and tail portions cannot always strictly be distinguished solely on a time basis, in practice, the head portion will seldom take up more than the first five milliseconds. The differences in amplitude also serve to distinguish between the two portions, with the tail portion essentially being representative of lower amplitude reverberations.

The preferred embodiment relies upon a substantial reduction in the complexity of the impulse response function through the removal of the low frequency components (say below 300 Hz) from the tail. Hence, in the preferred embodiment, the impulse response function to be utilised is manipulated in a predetermined manner. An example of the flowchart of the manipulation process is illustrated at 20 in FIG. 4. The initial impulse response 21 is divided into a direct sound portion 22 and a tail portion 23. The tail portion is high pass filtered 24 at frequencies above 300 Hz whilst the direct sound portion is optionally boosted at low frequencies 25 substantially below 300 Hz. The two impulse response fragments are combined at 26 before being output at 27. The output response can then be utilised in any subsequent downstream audio processing system. For example, the impulse response can then be combined with other impulse responses as described in PCT Patent Application No. PCT/AU99/00002 entitled "Audio Signal Processing Method and Apparatus", assigned to the present applicant, the contents of which are hereby incorporated specifically by cross reference. It will be appreciated that, in the time domain, the combined signal 28 will not look appreciably different from the original one, in that the visual effect of boosting and removal of the below 300 Hz components from the respective head and tail portions will not be substantial. However, the audible effect is significantly more marked. It will be appreciated that 300 Hz is an exemplary figure. In the case where, say, larger room spaces are being mimicked, frequencies of 200 Hz or less may be utilized in both the low and high pass filters.

Figure 5:
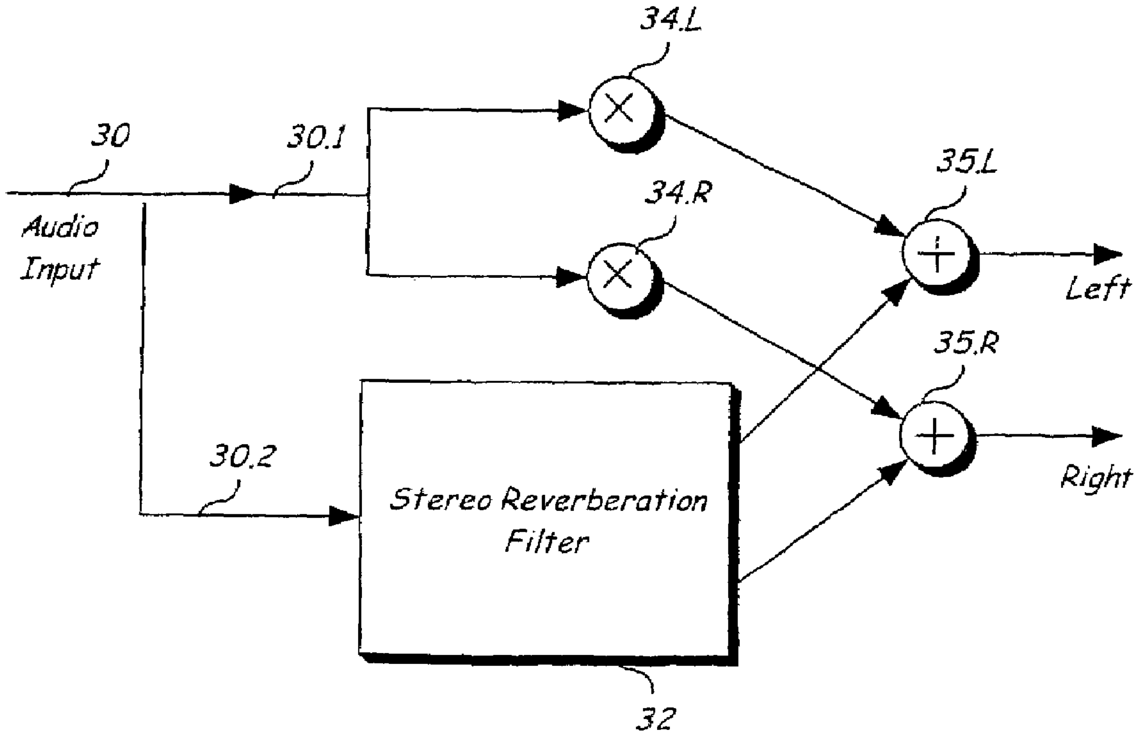
FIG. 5 illustrates flowchart-style part of a stereo audio signal processing arrangement.

Other forms of audio processing environments utilising the invention are also possible. For example, in FIG. 5, an audio input signal 30 is shown being split into respective direct and indirect paths 30.1 and 30.2. The direct path 30.1 is split again into left and right paths which undergo gain adjusting at 34.L and 34.R before being summed at 35.L and 35.R respectively. The second channel 30.2 undergoes processing by means of a stereo reverberation filter 32, the outputs of which are similarly summed at 35.L and 35.R to provide left and right stereo channels.

Figure 6:
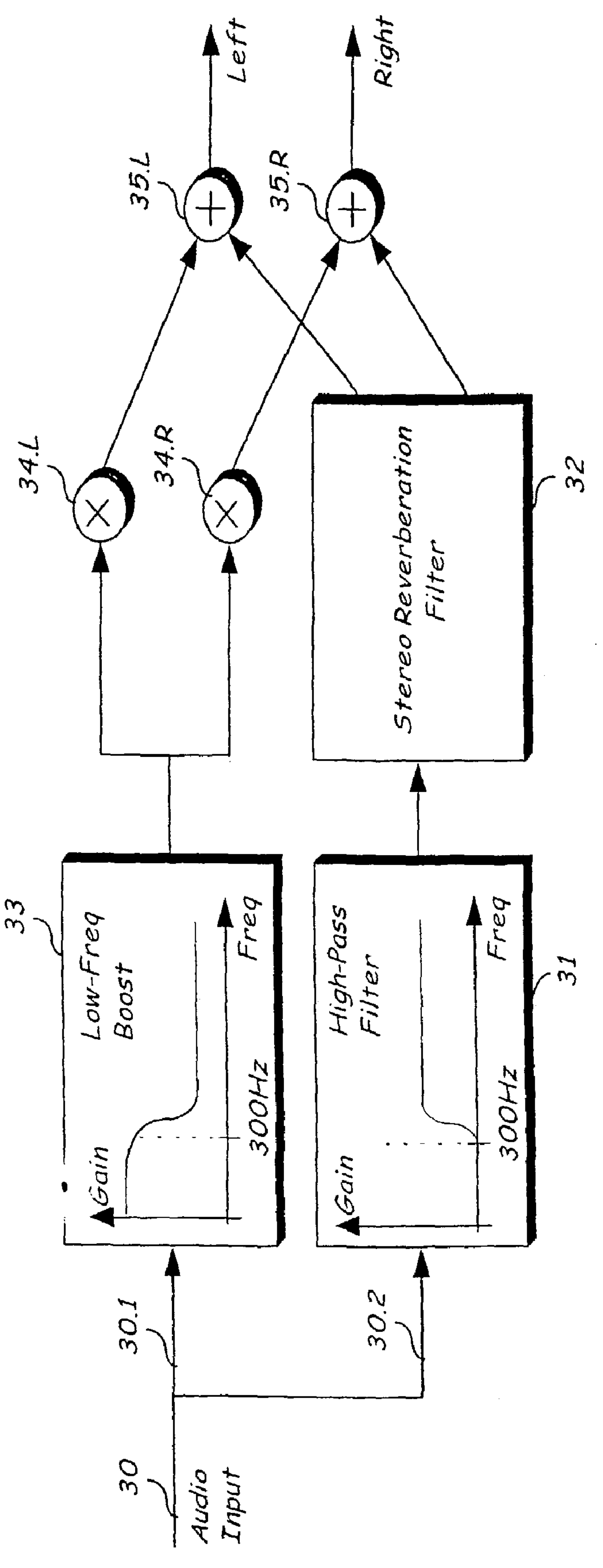
FIG. 6 illustrates a flowchart of a method and system of a second embodiment applied to the arrangement of FIG. 5.

In FIG. 6, the audio input signal 30 is shown being split in first and second channels 30.1 and 30.2, with the second channel 30.2 being high pass filtered at 31 by means of a high pass filter 34 prior to being processed by the stereo reverberation filter 32. The audio input signal of the first channel 30.1 is provided with a low frequency boost at 33, which has the effect of boosting the low frequency components of the signal, before being split into left and right inputs which are gain adjusted at 34L and 34R respectively, prior to being added at 35.L and 35.R to the output from the stereo reverberation filter 32, which effectively adds a "tail" to the high pass filtered audio signal output at 31. It will be appreciated that the high pass filter 31 and the reverberation filter 32 may be reversed in order. Alternatively, the high pass filter or a series of such filters may be built into the reverberation filter, which may be adapted to employ a "long convolution" reverberation procedure.

Figure 7:
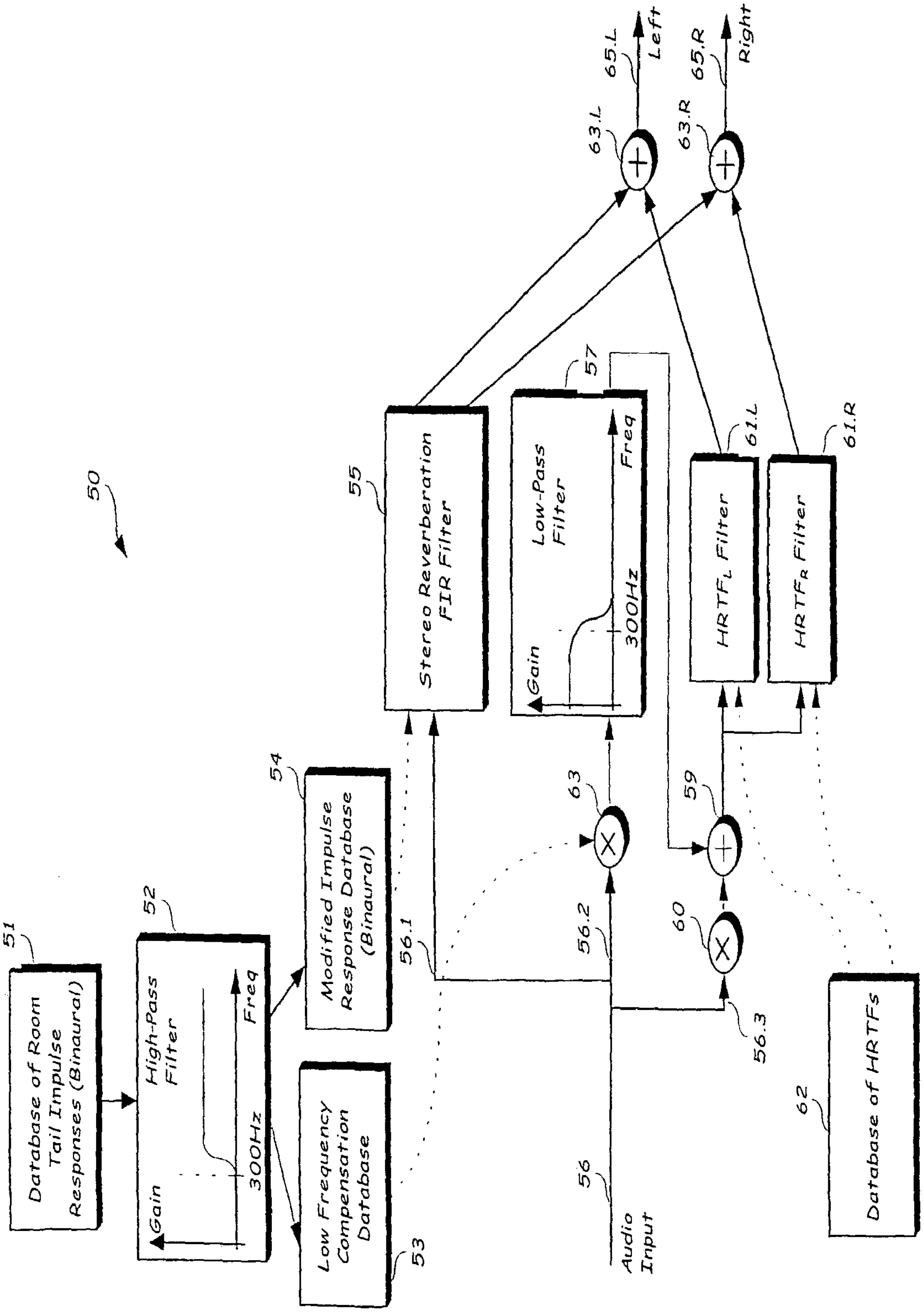
FIG. 7 shows a third embodiment of an audio processing system of the invention.

Referring now to FIG. 7, a further embodiment of an audio processing system 50 of the invention is shown which combines features of both the first and second embodiments. A database of binaural tail impulse responses in respect of rooms having different acoustic qualities 51 is passed through a high pass filter 52 which effectively removes the low frequency portions of the tail impulse responses. The extent of the frequency removal in respect of each tail impulse is measured, normalised and stored in a low frequency compensation database 53. At the same time, the corresponding modified impulse responses are stored in database 54. The low frequency compensation database thus provides, in respect of each modified impulse response, a compensation factor typically inversely proportional to the percentage of remaining low frequencies, which can then be used in the manner described below to compensate for the reduction in low frequency components of the signal as a whole. The modified tail impulses from the modified impulse response database are selectively fed to a stereo reverberation FIR (finite impulse response) filter 55.

An audio input 56 is streamed into three channels, with a first channel 56.1 being input into the stereo reverberation filter 55, and a second channel 56.2 being input into a low pass filter 57 via a multiplier 58. The gain of the multiplier 58 and the resultant gain of the low pass filter is determined by the compensation factor retrieved from the low frequency compensation database 53 in respect of the corresponding modified impulse responses stored in the database 54.

A third channel 56.3 is input to a summer 59 via an adjustable gain amplifier 60. The summer 59 sums the inputs from the independently adjustable gain amplifier 60 and from the output of the low pass filter 57. The summed output is fed through a pair of HRTF left and right filters 61.L and 61.R. A database of HRTF's or head impulse response portions 62 has inputs leading to the filters 61.L and 61.R. Selected HRTF's from the database 62 are convolved in the HRTF filters with the summed input signals so as to provide spatialized outputs to the left and right summers 63.L and 63.R, which also receive spatialized outputs from the stereo reverberation filter 55. Binaural spatialized output signals 65.L and 65.R are output from the respective summers 63.L and 63.R. Effectively, the audio input signal 56 is thus spatialised using tail and head portions of impulse responses which are modified in the manner described above. The removal of low frequency components from the tail impulse responses is compensated for at multiplier 58 by the proportional increase in low frequency components to the head or HRTF portion of the impulse response signal. Effectively, the overall proportion of low frequency components in the spatialized sound thus remains approximately the same, and is effectively shifted in the above described process from the tail portions to the head portions of the spatializing impulse responses.

Figure 3:
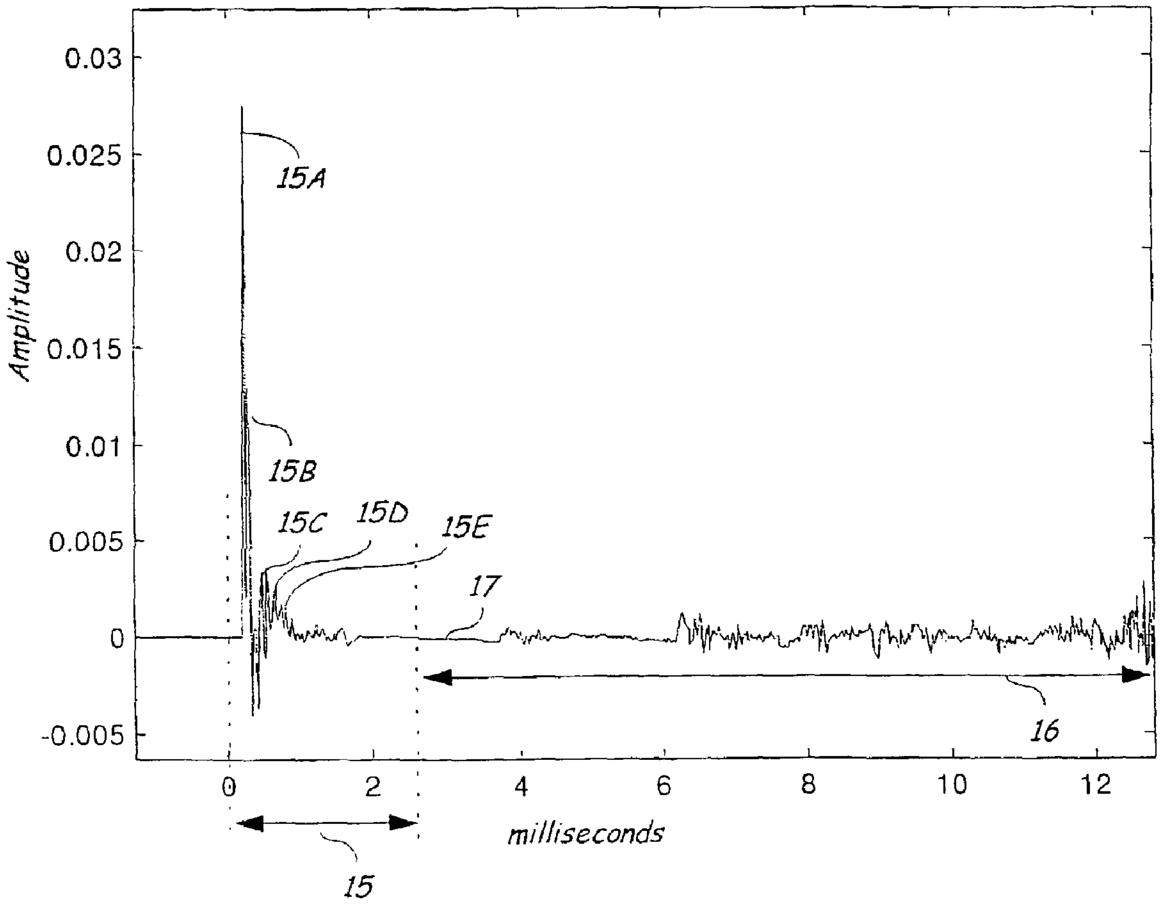
FIG. 3 illustrates in detail the first 20 ms of this typical response.
Figure 4:
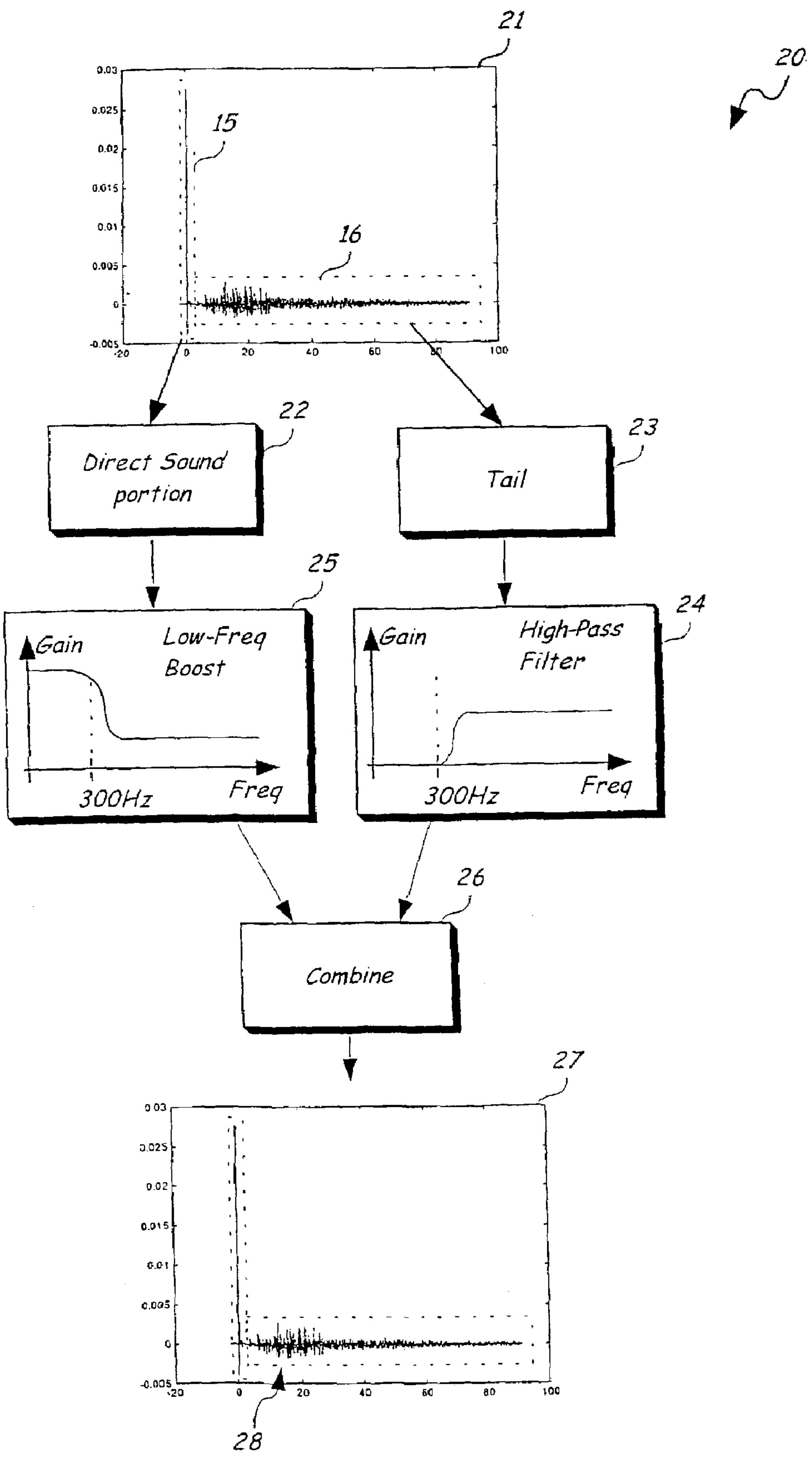
FIG. 4 illustrates a flowchart of a method and system of a first embodiment of the invention.

The filtering of the low frequency components in the arrangements of FIGS. 4, 6 and 7 has a number of advantages in addition to the simplification of the processing of the tail portion of the impulse response. These advantages include the elimination of possible resonant modes when the impulse response of FIGS. 2 and 3 is convolved with an input signal. Also, resonant modes in the reverberant filter type arrangements are also reduced, typically without changing the overall "feel" of the sound by keeping low frequency components relatively constant.

It will be appreciated to the person skilled in the art that numerous variations and/or modifications may be made to the present invention has shown the specific embodiments without departing from the spiritual scope of the inventions broadly described. The preferred embodiments are, therefore, to be considered in all respects to be illustrative and not restrictive.

The invention claimed is:

1. A method of forming an output impulse response function comprising the steps of:

(a) creating an initial impulse response having a head portion and a tail portion;

(b) high pass filtering at least part of said tail portion to form a high pass filtered tail portion;

(c) combining said high pass filtered tail portion with said head portion to form an output impulse response.

2. A method as claimed in claim 1 which includes the step of boosting low frequency components of said head portion of said initial impulse response prior to step (c).

3. A method as claimed in claim 2 which include the step of dividing the initial impulse response into the head and tail portions.

4. A method as claimed in claim 2 wherein said step of high pass filtering is arranged to suppress frequencies below substantially 200 to 300 Hz.

5. A method as claimed in claim 2 which further comprises the steps of:

utilising said output impulse response in addition to other impulse responses to virtually spatialize an audio signal around a listener;

providing a tail portion of an impulse response signal;

high pass filtering the tail portion;

convolving the high pass filtered tail portion with the audio signal;

convolving the head portion with the audio signal; and combining the convolved signals to provide a spatialized output signal.

6. A method as claimed in claim 1 which include the step of dividing the initial impulse response into the head and tail portions.

7. A method as claimed in claim 6 wherein said step of high pass filtering is arranged to suppress frequencies below substantially 200 to 300 Hz.

8. A method as claimed in claim 6 which further comprises the steps of:

utilising said output impulse response in addition to other impulse responses to virtually spatialize an audio signal around a listener;

providing a tail portion of an impulse response signal;

high pass filtering the tail portion;

convolving the high pass filtered tail portion with the audio signal;

convolving the head portion with the audio signal; and combining the convolved signals to provide a spatialized output signal.

9. A method as claimed in claim 1 wherein said step of high pass filtering is arranged to suppress frequencies below substantially 200 to 300 Hz.

10. A method as claimed in claim 9 which further comprises the steps of:

utilising said output impulse response in addition to other impulse responses to virtually spatialize an audio signal around a listener;

providing a tail portion of an impulse response signal;

high pass filtering the tail portion;

convolving the high pass filtered tail portion with the audio signal;

convolving the head portion with the audio signal; and combining the convolved signals to provide a spatialized output signal.

11. A method as claimed in claim 1 which further comprises the step of:

utilising said output impulse response in addition to other impulse responses to virtually spatialize an audio signal around a listener.

12. Apparatus for forming an output impulse response function comprising:

dividing means for dividing an initial impulse response into a head portion and a tail portion;

high pass filtering means for high pass filtering at least part of the tail portion to form a high pass filtered tail portion;

combining means for combining said high pass filtered tail portion with said head portion to form an output impulse response.

13. Apparatus as claimed in claim 12 which includes boosting means for boosting low frequency components of said head portion of said response.

14. Apparatus as claimed in claim 13 wherein said high pass filtering means is arranged to suppress frequencies below substantially 200 to 300 Hz.

15. Apparatus as claimed in claim 13 wherein said boosting means is arranged to boost low frequency components of said head portion of said initial response below substantially 200 to 300 Hz.

* * * * *